US012663716B2

(12) United States Patent
(10) Patent No.: US 12,663,716 B2
(45) Date of Patent: Jun. 23, 2026

Nishita et al.

(54) CHEMICAL-RESISTANT PROTECTIVE FILM

(71) Applicant: NISSAN CHEMICAL CORPORATION, Tokyo (JP)

(72) Inventors: Tokio Nishita, Toyama (JP); Yuki Endo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 609 days.

(21) Appl. No.: 18/025,336

(22) PCT Filed: Sep. 9, 2021

(86) PCT No.: PCT/JP2021/033084

§ 371 (c)(1),
(2) Date: Mar. 8, 2023

(87) PCT Pub. No.: WO2022/054853

PCT Pub. Date: Mar. 17, 2022

(65) Prior Publication Data

US 2023/0333470 A1 Oct. 19, 2023

(30) Foreign Application Priority Data

Sep. 10, 2020 (JP) ................................ 2020-151888

(51) Int. Cl.

| | |
|---|---|
| ***G03F 7/038*** | (2006.01) |
| ***G03F 7/004*** | (2006.01) |
| ***G03F 7/16*** | (2006.01) |
| ***G03F 7/20*** | (2006.01) |

(52) U.S. Cl.

CPC .......... *G03F 7/0385* (2013.01); *G03F 7/0045* (2013.01); *G03F 7/168* (2013.01); *G03F 7/2016* (2013.01)

(58) Field of Classification Search

CPC ...... G03F 7/0385; G03F 7/0045; G03F 7/168; G03F 7/2016; G03F 7/11; G03F 7/20; G03F 7/26; C08G 59/40; C08G 59/621; C09D 163/04; H01L 21/31; H01L 21/31058; H10P 14/60; H10P 95/08

USPC ........................ 430/311, 270.1, 271.1, 272.1

See application file for complete search history.

(56) References Cited

U.S. PATENT DOCUMENTS

| | | | | |
|---|---|---|---|---|
| 2018/0284615 | A1 | 10/2018 | Nagai et al. | |
| 2020/0131376 | A1 | 4/2020 | Tokunaga et al. | |
| 2022/0026806 | A1 | 1/2022 | Nishita et al. | |
| 2023/0114358 | A1* | 4/2023 | Hashimoto .......... | C09D 163/04 438/703 |

FOREIGN PATENT DOCUMENTS

| | | | |
|---|---|---|---|
| JP | 2008-26600 | A | 2/2008 |
| JP | 2008-39811 | A | 2/2008 |
| JP | 2018-173520 | A | 11/2018 |
| JP | 2019-020701 | A | 2/2019 |
| WO | 2008/117619 | A1 | 10/2008 |
| WO | 2018/203464 | A1 | 11/2018 |
| WO | 2020/153278 | A1 | 7/2020 |
| WO | 2021/200769 | A1 | 10/2021 |

OTHER PUBLICATIONS

Nov. 30, 2021 International Search Report Issued in International Patent Application No. PCT/JP2021/033084.

Mar. 7, 2023 International Preliminary Report on Patentability issued in International Patent Application No. PCT/JP2021/033084.

Jan. 24, 2025 Office Action issued in Chinese Patent Application No. 202180061886.9.

* cited by examiner

*Primary Examiner* — Caleen O Sullivan

(74) *Attorney, Agent, or Firm* — Oliff PLC

(57) ABSTRACT

A protective film formation composition contains a polymer having a unit structure represented by formula (1-1), a compound or a polymer having phenolic hydroxy group other than catechol, (C) a thermal acid generator, and (D) a solvent.

Formula (1-1)

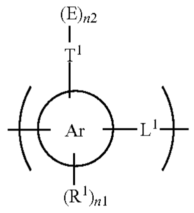

(Ar represents a benzene, naphthalene, or an anthracene ring; R1 represents a hydroxy, mercapto, amino, halogeno, or an alkyl group that has 1-10 carbon atoms and that may be substituted or interrupted by a hetero atom and may be substituted by a hydroxy group; n1 represents an integer of 0-3; L1 represents a single bond or an alkylene group having 1-10 carbon atoms; E represents an epoxy group; when n2=1, T1 represents a single bond or an alkylene group having 1-10 carbon atoms and may be interrupted by an ether bond, an ester bond, or an amide bond; and when n2=2, T1 represents a nitrogen atom or an amide bond.)

22 Claims, No Drawings

CHEMICAL-RESISTANT PROTECTIVE FILM

TECHNICAL FIELD

The present invention relates to a composition for forming a protective film having excellent resistance, particularly to a wet etching liquid for semiconductor in a lithography process in the production of a semiconductor. In addition, the present invention relates to a protective film formed from the composition, a method for producing a substrate having a resist pattern using the protective film, and a method for producing a semiconductor device.

BACKGROUND ART

A lithography process in the production of a semiconductor has been widely known, in which a resist underlayer film is formed between a substrate and a resist film formed on the substrate, forming a resist pattern having a desired form. The resist pattern is formed and then processing of the substrate is conducted, and, in the step for that processing, dry etching is mainly used, but wet etching is used according to the type of the substrate. Patent Literature 1 discloses a resist underlayer film material having a resistance to an alkaline aqueous hydrogen peroxide solution.

CITATION LIST

Patent Literature

Patent Literature 1: JP 2018-173520 A

SUMMARY OF INVENTION

Technical Problem

In the case where a protective film for semiconductor substrate is formed using a composition for forming a protective film, and the substrate is processed by wet etching using the protective film as an etching mask, the protective film is required to function as an excellent mask against the wet etching liquid for semiconductor (that is, the substrate can be protected in the masked portions of the substrate).

Moreover, there is desired a composition for forming a protective film that can provide a flat film having excellent step coverage with respect to the so-called stepped substrate and leaving a small difference in thickness after burying.

Conventionally, for obtaining a film exhibiting a resistance to SC-1 (ammonia-hydrogen peroxide solution), which is one of wet etching chemical liquids, a method of applying a low molecular weight compound (for example, gallic acid) as an additive to the film has been used, but such a method could not completely solve the above-mentioned problems.

Furthermore, the protective film used for the above-mentioned purposes is expected to function as a resist underlayer film for solving the so-called troubles at the time of resist pattern formation (such as poor form).

An object of the present invention is to solve the above-mentioned problems.

Solution to Problem

The present invention encompasses the followings.

[1] A composition for forming a protective film against a wet etching liquid for semiconductor, the composition for forming a protective film comprising:

(A) a polymer having a unit structure represented by the following formula (1-1):

[Formula 1]

Formula (1-1)

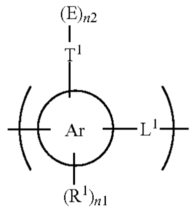

wherein Ar represents a benzene ring, a naphthalene ring, or an anthracene ring; $R^1$ represents a hydroxy group, a mercapto group optionally protected by a methyl group, an amino group optionally protected by a methyl group, a halogeno group, or an alkyl group having 1 to 10 carbon atoms and being optionally substituted with or interrupted by a heteroatom and optionally substituted with a hydroxy group; n1 represents an integer of 0 to 3; $L^1$ represents a single bond or an alkylene group having 1 to 10 carbon atoms; E represents an epoxy group; and, when n2 is 1, $T^1$ represents a single bond or an alkylene group having 1 to 10 carbon atoms and being optionally interrupted by an ether linkage, ester linkage, or amide linkage; and, when n2 is 2, $T^1$ represents a nitrogen atom or an amide linkage;

(B) a compound or polymer having a phenolic hydroxy group other than catechol;

(C) a thermal acid generator; and (D) a solvent.

[2] The composition for forming a protective film according to item [1], wherein the compound or polymer (B) has two or more phenolic hydroxy groups.

[3] The composition for forming a protective film according to item [1] or [2], wherein the compound or polymer (B) is represented by the following formula (2-1):

[Formula 2]

(Formula 2-1)

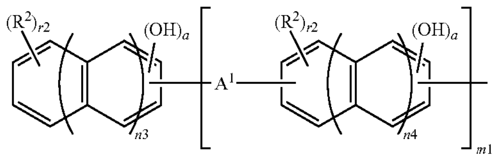

-continued

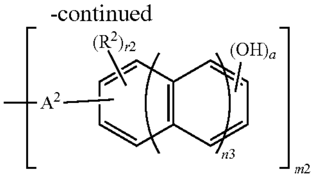

wherein each of $R^2$ and $T^2$ independently represents a halogeno group, a carboxy group, a nitro group, a cyano group, a methylenedioxy group, an acetoxy group, a methylthio group, an alkoxy group having 1 to 9 carbon atoms, an amino group optionally substituted with an alkyl group having 1 to 3 carbon atoms, a hydroxy group, or an alkyl group having 1 to 10 carbon atoms and being optionally substituted with a halogeno group; each of $A^1$ and $A^2$ independently is an alkylene group having 1 to 10 carbon atoms, a divalent organic group derived from a bicyclo-ring compound, a biphenylene group, a divalent organic group represented by $—CT^2T^3$-, or a combination thereof, wherein $T^3$ represents a hydrogen atom or a monovalent group represented by (formula 2-1-a):

[Formula 3]

(Formula 2-1-a)

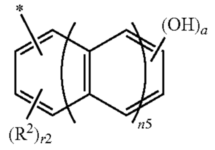

wherein, in (formula 2-1-a), * represents a bonding site to the carbon atom to which $T^3$ is bonded, and a represents an integer of 1 to 6;

each of n3 to n5 independently represents an integer of 0 to 2; r2 represents an integer of 0 to 3; and each of m1 and m2 independently represents a number of 0 to 10,000,000.

[4] The composition for forming a protective film according to item [3], wherein m1, n3 to n5, and r2 are 0; and m2 is 1.

[5] The composition for forming a protective film according to item [1] or [2], wherein the compound or polymer (B) is a compound represented by the following formula (2-2):

[Formula 4]

(Formula 2-2)

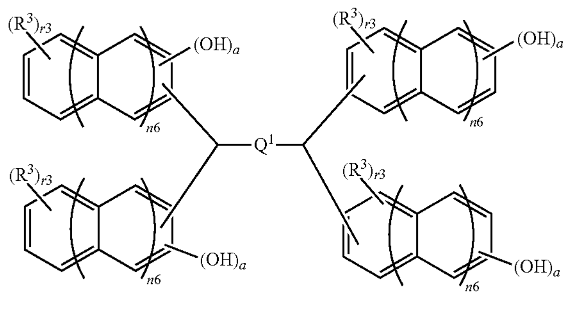

wherein $R^3$ represents a halogeno group, a carboxy group, a nitro group, a cyano group, a methylenedioxy group, an acetoxy group, a methylthio group, an alkoxy group having 1 to 9 carbon atoms, an amino group optionally substituted with an alkyl group having 1 to 3 carbon atoms, a hydroxy group, or an alkyl group having 1 to 10 carbon atoms and being optionally substituted with a halogeno group; $Q^1$ represents a single bond, an oxygen atom, a sulfur atom, a sulfonyl group, a carbonyl group, an imino group, an arylene group having 6 to 40 carbon atoms, or an alkylene group having 1 to 10 carbon atoms and being optionally substituted with a halogeno group; a represents an integer of 1 to 6; n6 represents an integer of 0 to 2; and r3 represents an integer of 0 to 3.

[6] The composition for forming a protective film according to item [1] or [2], wherein the compound or polymer (B) is a polymer having a unit structure represented by the following formula (3-1):

[Formula 5]

(Formula 3-1)

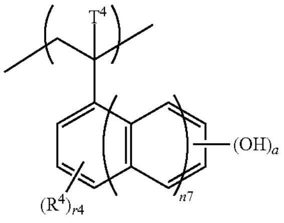

wherein $T^4$ represents a hydrogen atom in addition to the alkyl group having 1 to 10 carbon atoms and being optionally substituted with a halogeno group; $R^4$ represents a halogeno group, a carboxy group, a nitro group, a cyano group, a methylenedioxy group, an acetoxy group, a methylthio group, an alkoxy group having 1 to 9 carbon atoms, an amino group optionally substituted with an alkyl group having 1 to 3 carbon atoms, a hydroxy group, or an alkyl group having 1 to 10 carbon atoms and being optionally substituted with a halogeno group; r4 represents an integer of 0 to 3; n7 represents an integer of 0 to 2; and a represents an integer of 1 to 6.

[7] A protective film against a wet etching liquid for semiconductor, which is a baked product of an applied film comprising the composition for forming a protective film according to any one of items [1] to [6].

[8] A resist underlayer film-forming composition comprising:

(A) a polymer having a unit structure represented by the following formula (1-1):

[Formula 6]

Formula (1-1)

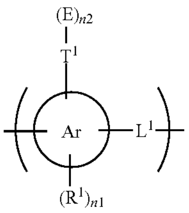

wherein Ar represents a benzene ring, a naphthalene ring, or an anthracene ring; $R^1$ represents a hydroxy group, a mercapto group optionally protected by a methyl group, an amino group optionally protected by a methyl group, a halogeno group, or an alkyl group having 1 to 10 carbon atoms and being optionally substituted with or interrupted by a heteroatom and optionally substituted with a hydroxy group; n1 represents an integer of 0 to 3; $L^1$ represents a single bond or an alkylene group having 1 to 10 carbon atoms; E represents an epoxy group; and, when n2 is 1, $T^1$ represents a single bond or an alkylene group having 1 to 10 carbon atoms and being optionally interrupted by an ether linkage, ester linkage, or amide linkage; and, when n2 is 2, $T^1$ represents a nitrogen atom or an amide linkage;

(B) a compound or polymer having a phenolic hydroxy group other than catechol;

(C) a thermal acid generator; and (D) a solvent.

[9] A resist underlayer film, which is a baked product of an applied film comprising the resist underlayer film-forming composition according to item [8].

[10] A method for producing a substrate having a protective film, for use in the manufacture of a semiconductor, comprising the steps of:

applying the composition for forming a protective film according to any one of items [1] to [6] onto a stepped semiconductor substrate, and baking the applied composition to form a protective film.

[11] A method for producing a substrate having a resist pattern, for use in the manufacture of a semiconductor, comprising the steps of:

applying the composition for forming a protective film according to any one of items [1] to [6] or the resist underlayer film-forming composition according to item [8] onto a semiconductor substrate, and baking the applied composition to form a protective film as a resist underlayer film, and forming a resist film on the protective film and then subjecting the resist film to exposure and development to form a resist pattern.

[12] A method for producing a semiconductor device, comprising the steps of:

forming a protective film on a semiconductor substrate optionally having an inorganic film formed on a surface thereof using the composition for forming a protective film according to any one of items [1] to [6], forming a resist pattern on the protective film, subjecting the protective film to dry etching using the formed resist pattern as a mask so as to expose a surface of the semiconductor substrate or inorganic film, and using the dry-etched protective film as a mask, subjecting the semiconductor substrate or inorganic film to wet etching using a wet etching liquid for semiconductor, and then to washing.

[13] A method for producing a semiconductor device, comprising the steps of:

forming a resist underlayer film on a semiconductor substrate optionally having an inorganic film formed on a surface thereof using the resist underlayer film-forming composition according to item [8], forming a resist pattern on the resist underlayer film, subjecting the resist underlayer film to dry etching using the formed resist pattern as a mask so as to expose a surface of the semiconductor substrate or inorganic film, and using the dry-etched resist underlayer film as a mask, subjecting the semiconductor substrate or inorganic film to etching.

Advantageous Effects of Invention

The composition for forming a protective film of the present invention is required to have, for example, the following properties with a good balance in a lithography process in the production of a semiconductor: (1) functioning as an excellent mask against a wet etching liquid used during the processing of a substrate; (2) further having such a low dry etching rate that reduces a damage to the protective film or resist underlayer film during the processing of a substrate; (3) having excellent planarization properties for a stepped substrate; and (4) having excellent embedding properties for a substrate having a very fine trench pattern. By virtue of having the properties (1) to (4) with a good balance, the composition enables easy microfabrication for a semiconductor substrate.

DESCRIPTION OF EMBODIMENTS

<Composition for Forming a Protective Film Against a Wet Etching Liquid for Semiconductor>

The composition for forming a protective film against a wet etching liquid for semiconductor according to the present invention comprises:

(A) a polymer having a unit structure represented by the following formula (1-1):

[Formula 7]

Formula (1-1)

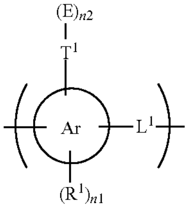

wherein Ar represents a benzene ring, a naphthalene ring, or an anthracene ring; $R^1$ represents a hydroxy group, a mercapto group optionally protected by a methyl group, an amino group optionally protected by a methyl group, a halogeno group, or an alkyl group having 1 to 10 carbon atoms and being optionally substituted with or interrupted by a heteroatom and optionally substituted with a hydroxy group; n1 represents an integer of 0 to 3; $L^1$ represents a single bond or an alkylene group having 1 to 10 carbon atoms; E represents an epoxy group; and, when n2 is 1, $T^1$ represents a single bond or an alkylene group having 1 to 10 carbon atoms and being optionally interrupted by an ether linkage, ester linkage, or amide linkage; and, when n2 is 2, $T^1$ represents a nitrogen atom or an amide linkage;

(B) a compound or polymer having a phenolic hydroxy group other than catechol;

(C) a thermal acid generator; and (D) a solvent.

<Polymer (A)>

Polymer (A) used in the present invention is a polymer having a unit structure represented by the following formula (1-1):

[Formula 8]

Formula (1-1)

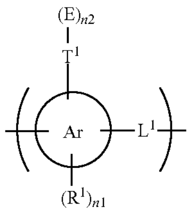

wherein Ar represents a benzene ring, a naphthalene ring, or an anthracene ring; $R^1$ represents, as a substituent for the hydrogen atom of the above benzene ring, naphthalene ring, or anthracene ring, a hydroxy group, a mercapto group optionally protected by a methyl group, an amino group optionally protected by a methyl group, a halogeno group, or an alkyl group having 1 to 10 carbon atoms and being optionally substituted with or interrupted by a heteroatom and optionally substituted with a hydroxy group; n1 represents an integer of 0 to 3; $L^1$ represents a single bond or an alkylene group having 1 to 10 carbon atoms; E represents an epoxy group; when n2 is 1, $T^1$ represents a single bond or an alkylene group having 1 to 10 carbon atoms and being optionally interrupted by an ether linkage, ester linkage, or amide linkage; and, when n2 is 2, $T^1$ represents a nitrogen atom or an amide linkage.

Examples of the alkyl groups having 1 to 10 carbon atoms include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, a 2-ethyl-3-methyl-cyclopropyl group, a decyl group, a methoxy group, an ethoxy group, a methoxymethyl group, an ethoxymethyl group, a methoxyethyl group, an ethoxyethyl group, a hydroxymethyl group, a 1-hydroxyethyl group, a 2-hydroxyethyl group, a methylamino group, a dimethylamino group, a diethylamino group, an aminomethyl group, a 1-aminoethyl group, a 2-aminoethyl group, a methylthio group, an ethylthio group, a mercaptomethyl group, a 1-mercaptoethyl group, and a 2-mercaptoethyl group.

Examples of the alkylene groups having 1 to 10 carbon atoms include a methylene group, an ethylene group, a n-propylene group, an isopropylene group, a cyclopropylene group, a n-butylene group, an isobutylene group, a s-butylene group, a t-butylene group, a cyclobutylene group, a 1-methyl-cyclopropylene group, a 2-methyl-cyclopropylene group, a n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, 2,2-dimethyl-n-propylene, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, a n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, a 2-ethyl-3-methyl-cyclopropylene group, a n-heptylene group, a n-octylene group, a n-nonylene group, and a n-decanylene group.

$R^1$ may be an alkoxy group having 1 to 10 carbon atoms.

Examples of alkoxy groups having 1 to 10 carbon atoms include a methoxy group, an ethoxy group, a n-propoxy group, an i-propoxy group, a n-butoxy group, an i-butoxy group, a s-butoxy group, a t-butoxy group, a n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2,-trimethyl-n-propoxy group, a 1-ethyl-1-methyl-n-propoxy group, a 1-ethyl-2-methyl-n-propoxy group, a n-heptyloxy group, a n-octyloxy group, and a n-nonyloxy group.

With respect to the unit structure represented by formula (1-1) above, a single type of the unit structure or a combination of two or more types of the unit structures may be employed. For example, polymer (A) may be a copolymer having a plurality of unit structures which have the same Ar. And a copolymer having a plurality of unit structures which have different types of Ar's, for example, a copolymer having a unit structure containing a benzene ring and a unit structure containing a naphthalene ring as Ar, is not excluded from the technical scope of the present invention.

The expression "being optionally interrupted" means that, in the case of an alkylene group having 2 to 10 carbon atoms, the alkylene group is interrupted at a site between the carbon atoms in the alkylene group by a heteroatom (i.e., an ether linkage when the heteroatom is oxygen, or a sulfide linkage when the heteroatom is sulfur), an ester linkage, or an amide linkage; and it means that, in the case of an alkylene group having one carbon atom (i.e., a methylene group), the methylene group has at any one site of the carbon a heteroatom (i.e., an ether linkage when the heteroatom is oxygen, or a sulfide linkage when the heteroatom is sulfur), an ester linkage, or an amide linkage.

When n2 is 1, $T^1$ represents a single bond or an alkylene group having 1 to 10 carbon atoms and being optionally interrupted by an ether linkage, ester linkage, or amide linkage; but preferred is a combination of an ether linkage and a methylene group (that is, "-$T^1$-(E)n2" in formula (1-1) is a glycidyl ether group), a combination of an ester linkage and a methylene group, or a combination of an amide linkage and a methylene group.

The term "alkyl group having 1 to 10 carbon atoms and being optionally substituted with a heteroatom" means that one or more hydrogen atoms of the alkyl group having 1 to 10 carbon atoms are substituted with a heteroatom (preferably a halogeno group).

$L^1$ represents a single bond or an alkylene group having 1 to 10 carbon atoms; but is preferably represented by the following formula (1-2):

[Formula 9]

Formula (1-2)

$$—CR^2R^3—$$

wherein each of $R^2$ and $R^3$ independently represents a hydrogen atom, a methyl group, an ethyl group, a n-propyl group, an i-propyl group, a cyclopropyl group, a n-butyl group, an i-butyl group, a s-butyl group, a t-butyl group, or a cyclobutyl group; and $R^2$ and $R^3$ are optionally bonded together to form a ring having 3 to 6 carbon atoms. Especially, it is preferred that both of $R^2$ and $R^3$ are a hydrogen atom (that is, —($CR^2R^3$)— is a methylene group).

The halogeno group indicates halogen-X (F, Cl, Br, or I) that replaces hydrogen.

With respect to polymer (A), there is no particular limitation as long as the polymer satisfies the unit structure of formula (1-1) above. Polymer (A) may be one which is produced by a known method. Any commercially available product of the polymer may be used. Examples of commercially available products of the polymer include heat-resistant epoxy novolak resin EOCN (registered trademark) series (manufactured by Nippon Kayaku Co., Ltd.), and epoxy novolak resin D.E.N (registered trademark) series (manufactured by Dow Chemical Japan Limited).

Polymer (A) has a weight average molecular weight of 100 or more, 500 to 200,000, 600 to 50,000, or 700 to 10,000.

Examples of polymer (A) in the present invention include those having a unit structure shown below.

[Formula 10]

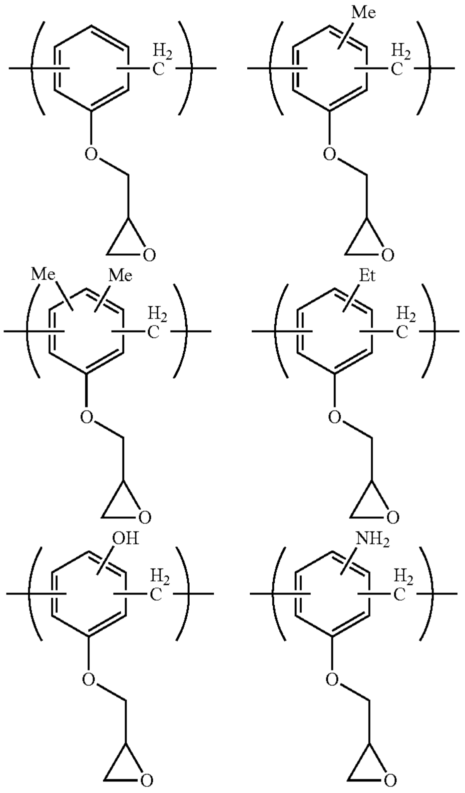

-continued

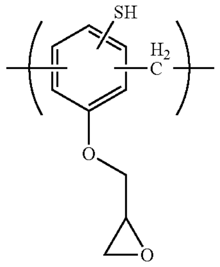

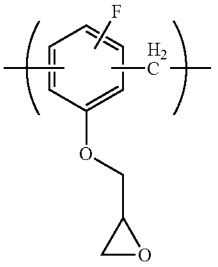

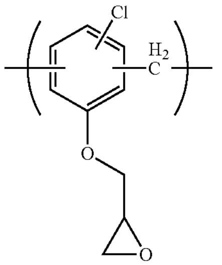

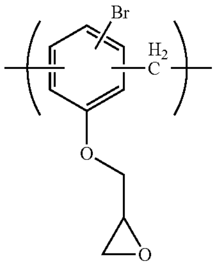

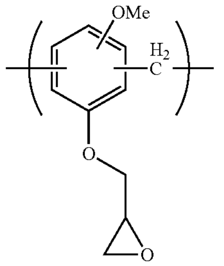

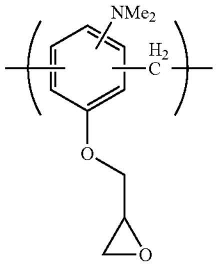

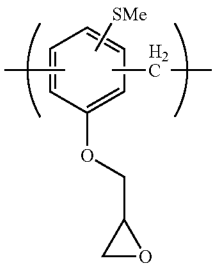

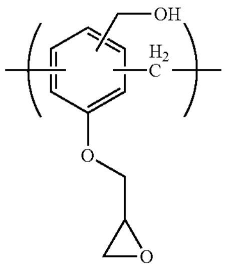

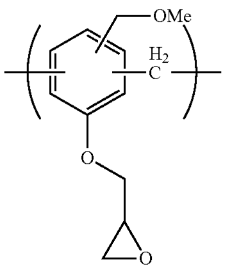

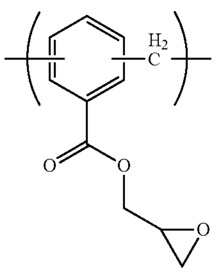

-continued

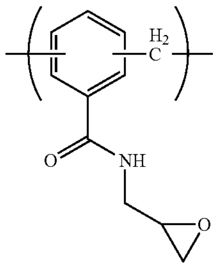

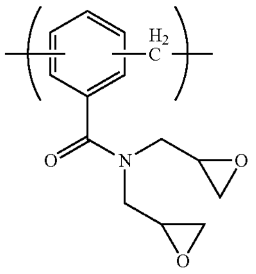

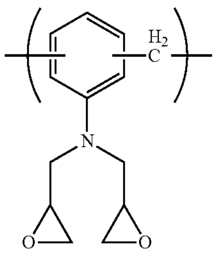

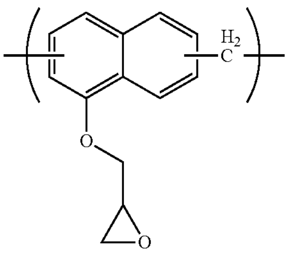

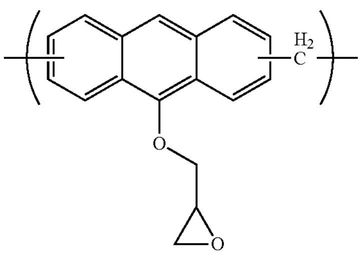

<(B) Compound or Polymer Having a Phenolic Hydroxy Group Other than Catechol>

With respect to compound or polymer (B) having a phenolic hydroxy group other than catechol, there is no particular limitation as long as the compound or polymer does not harm the advantageous effects of the present invention. Needless to say, compound or polymer (B) having a phenolic hydroxy group other than catechol is different from the above-mentioned polymer (A).

With respect to the weight average molecular weight of compound or polymer (B) having a phenolic hydroxy group other than catechol, there is no particular limitation, but, for example, the weight average molecular weight is within the range of 300 to 50,000.

It is preferred that compound or polymer (B) has two or more phenolic hydroxy groups.

[1] Compound or Polymer Represented by Formula (2-1)

Compound (B) is preferably represented by the following formula (2-1):

[Formula 11]

(Formula 2-1)

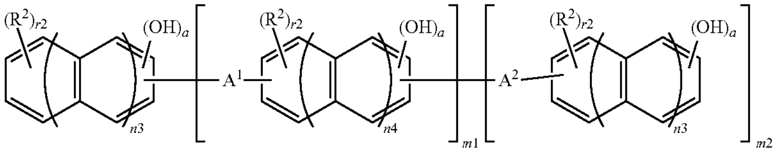

[Formula 12]

(Formula 2-1-a)

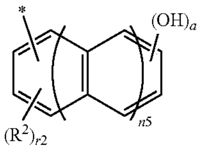

wherein each of $R^2$ and $T^2$ independently represents a halogeno group, a carboxy group, a nitro group, a cyano group, a methylenedioxy group, an acetoxy group, a methylthio group, an alkoxy group having 1 to 9 carbon atoms, an amino group optionally substituted with an alkyl group having 1 to 3 carbon atoms, a hydroxy group, or an alkyl group having 1 to 10 carbon atoms and being optionally substituted with a halogeno group; each of $A^1$ and $A^2$ independently is an alkylene group having 1 to 10 carbon atoms, a divalent organic group derived from a bicyclo-ring compound, a biphenylene group, a divalent organic group represented by $—CT^2T^3$-, or a combination thereof, wherein $T^3$ represents a hydrogen atom or a monovalent group represented by (formula 2-1-a), wherein, in (formula 2-1-a), * represents a bonding site to the carbon atom to which $T^3$ is bonded, and a represents an integer of 1 to 6; each of n3 to n5 independently represents an integer of 0 to 2; r2 represents an integer of 0 to 3; and each of m1 and m2 independently represents 0 to 10,000,000.

It is preferred that m1, n3 to n5, and r2 are 0 and m2 is 1.

The description of the halogeno group, alkoxy group, and alkyl group for formula (2-1) above is as given above.

Examples of the bicyclo-ring compounds include dicyclopentadiene, substituted dicyclopentadiene, tetracyclo[4.4.0.12,5.17,10]dodeca-3,8-diene, and substituted tetracyclo[4.4.0.12,5.17,10]dodeca-3,8-diene. The term "substituted" used for the bicyclo-ring compound means that one or two or more hydrogen atoms of the bicyclo-ring compound is/are independently replaced by a halogeno group, a nitro group, an amino group, a hydroxy group, or an alkyl group having 1 to 10 carbon atoms or an aryl group having 6 to 40 carbon atoms, each being optionally substituted with the above-mentioned group. The term "divalent organic group derived from a bicyclo-ring compound" means a group having two bonding sites, which is derivable by removing two arbitrary hydrogen atoms from the bicyclo-ring compound.

Examples of the aryl groups having 6 to 40 carbon atoms include a phenyl group, an o-methylphenyl group, a m-methylphenyl group, a p-methylphenyl group, an o-chlorphenyl group, a m-chlorphenyl group, a p-chlorphenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, a m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Specific examples of the compound represented by formula (2-1) above include:

[Formula 13]

(2-1-a)

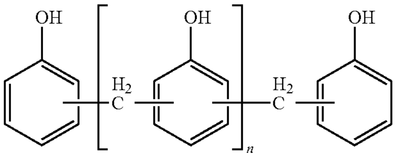

(2-1-b)

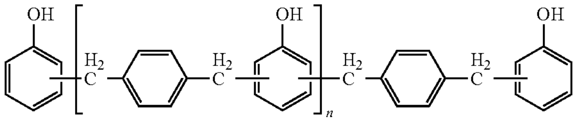

-continued (2-1-d)

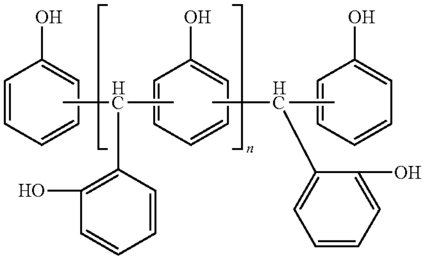

(2-1-c)

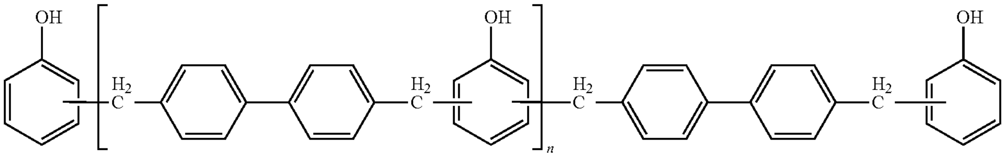

(2-1-e)

(2-1-f)

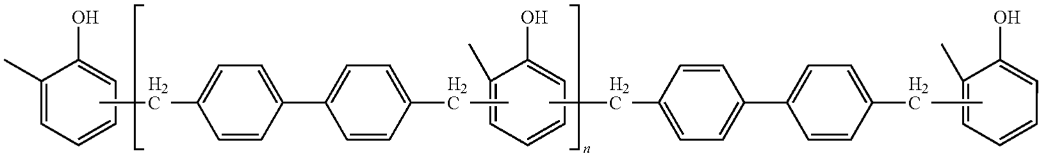

(2-1-g)

(2-1-h)

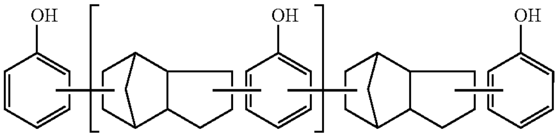

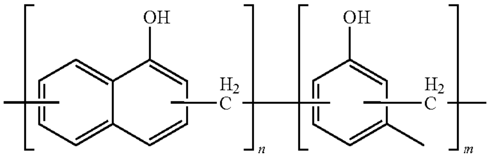

Compound (B) having a phenolic hydroxy group other than catechol may be a compound shown below.

[Formula 14]

(2-1-c)

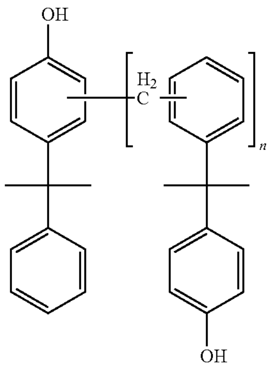

1 ≤ n ≤ 4

[2] Compound Represented by Formula (2-2)

With respect to compound (B), there is no particular limitation as long as the compound is compound (B) having a phenolic hydroxy group other than catechol and does not harm the advantageous effects of the present invention, but compound (B) is preferably represented by the following formula (2-2):

[Formula 15]

(Formula 2-2)

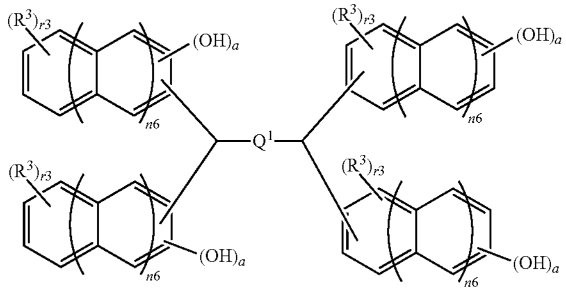

wherein $R^3$ represents a halogeno group, a carboxy group, a nitro group, a cyano group, a methylenedioxy group, an acetoxy group, a methylthio group, an alkoxy group having 1 to 9 carbon atoms, an amino group optionally substituted with an alkyl group having 1 to 3 carbon atoms, a hydroxy group, or an alkyl group having 1 to 10 carbon atoms and being optionally substituted with a halogeno group; $Q^1$ represents a single bond, an oxygen atom, a sulfur atom, a sulfonyl group, a carbonyl group, an imino group, an arylene group having 6 to 40 carbon atoms, or an alkylene group having 1 to 10 carbon atoms and being optionally substituted with a halogeno group; a represents an integer of 1 to 6; n6 represents an integer of 0 to 2; and r3 represents an integer of 0 to 3.

The description of the alkoxy group, alkyl group, and halogeno group for formula (2-2) is as given above.

Examples of arylene groups having 6 to 40 carbon atoms include a phenylene group, an o-methylphenylene group, a m-methylphenylene group, a p-methylphenylene group, an o-chlorphenylene group, a m-chlorphenylene group, a p-chlorphenylene group, an o-fluorophenylene group, a p-fluorophenylene group, an o-methoxyphenylene group, a p-methoxyphenylene group, a p-nitrophenylene group, a p-cyanophenylene group, an α-naphthylene group, a β-naphthylene group, an o-biphenylylene group, a m-biphenylylene group, a p-biphenylylene group, a 1-anthrylene group, a 2-anthrylene group, a 9-anthrylene group, a 1-phenanthrylene group, a 2-phenanthrylene group, a 3-phenanthrylene group, a 4-phenanthrylene group, and a 9-phenanthrylene group.

Examples of alkylene groups having 1 to 10 carbon atoms include a methylene group, an ethylene group, a n-propylene group, an isopropylene group, a cyclopropylene group, a n-butylene group, an isobutylene group, a s-butylene group, a t-butylene group, a cyclobutylene group, a 1-methyl-cyclopropylene group, a 2-methyl-cyclopropylene group, a n-pentylene group, a 1-methyl-n-butylene group, a 2-methyl-n-butylene group, a 3-methyl-n-butylene group, a 1,1-dimethyl-n-propylene group, a 1,2-dimethyl-n-propylene group, a 2,2-dimethyl-n-propylene group, a 1-ethyl-n-propylene group, a cyclopentylene group, a 1-methyl-cyclobutylene group, a 2-methyl-cyclobutylene group, a 3-methyl-cyclobutylene group, a 1,2-dimethyl-cyclopropylene group, a 2,3-dimethyl-cyclopropylene group, a 1-ethyl-cyclopropylene group, a 2-ethyl-cyclopropylene group, a n-hexylene group, a 1-methyl-n-pentylene group, a 2-methyl-n-pentylene group, a 3-methyl-n-pentylene group, a 4-methyl-n-pentylene group, a 1,1-dimethyl-n-butylene group, a 1,2-dimethyl-n-butylene group, a 1,3-dimethyl-n-butylene group, a 2,2-dimethyl-n-butylene group, a 2,3-dimethyl-n-butylene group, a 3,3-dimethyl-n-butylene group, a 1-ethyl-n-butylene group, a 2-ethyl-n-butylene group, a 1,1,2-trimethyl-n-propylene group, a 1,2,2-trimethyl-n-propylene group, a 1-ethyl-1-methyl-n-propylene group, a 1-ethyl-2-methyl-n-propylene group, a cyclohexylene group, a 1-methyl-cyclopentylene group, a 2-methyl-cyclopentylene group, a 3-methyl-cyclopentylene group, a 1-ethyl-cyclobutylene group, a 2-ethyl-cyclobutylene group, a 3-ethyl-cyclobutylene group, a 1,2-dimethyl-cyclobutylene group, a 1,3-dimethyl-cyclobutylene group, a 2,2-dimethyl-cyclobutylene group, a 2,3-dimethyl-cyclobutylene group, a 2,4-dimethyl-cyclobutylene group, a 3,3-dimethyl-cyclobutylene group, a 1-n-propyl-cyclopropylene group, a 2-n-propyl-cyclopropylene group, a 1-isopropyl-cyclopropylene group, a 2-isopropyl-cyclopropylene group, a 1,2,2-trimethyl-cyclopropylene group, a 1,2,3-trimethyl-cyclopropylene group, a 2,2,3-trimethyl-cyclopropylene group, a 1-ethyl-2-methyl-cyclopropylene group, a 2-ethyl-1-methyl-cyclopropylene group, a 2-ethyl-2-methyl-cyclopropylene group, a 2-ethyl-3-methyl-cyclopropylene group, a n-heptylene group, a n-octylene group, a n-nonylene group, and a n-decanylene group.

Specific examples of the compound represented by formula (2-2) above include the compounds shown below.

[Formula 16]

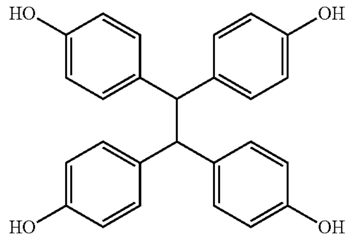

(2-2-g)

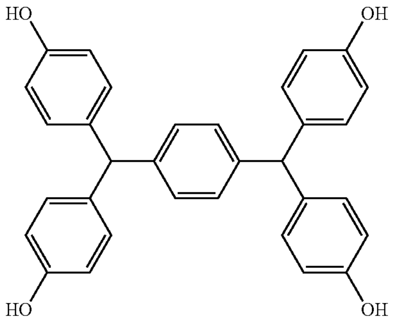

(2-2-h)

Compound (B) may be represented by the following formula (4-1):

[Formula 17]

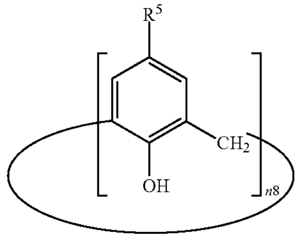

Formula (4-1)

wherein $R^5$ represents a halogeno group, a carboxy group, a nitro group, a cyano group, a methylenedioxy group, an acetoxy group, a methylthio group, an alkoxy group having 1 to 9 carbon atoms, an amino group optionally substituted with an alkyl group having 1 to 3 carbon atoms, a hydroxy group, or an alkyl group having 1 to 10 carbon atoms and being optionally substituted with a halogeno group; and n8 represents an integer of 4, 5, 6, or 8.

The description of the above terms is as given above.

Specific examples of the compound represented by formula (4-1) are shown below.

[Formula 18]

(2-2-q)

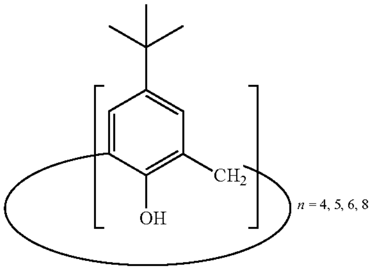

(2-2-r)

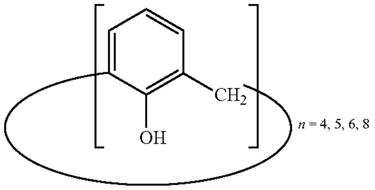

Compound (B) may be the following formula (5-1) and formula (5-1-a):

[Formula 19]

Formula (5-1)

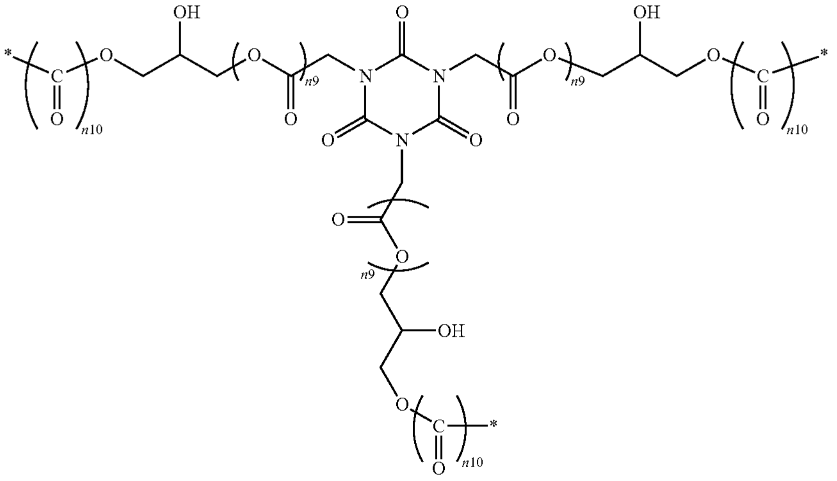

Formula (5-1-a)

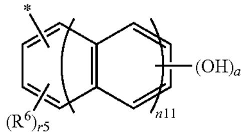

wherein each of n9 and n10 represents an integer of 0 or 1; $R^6$ represents a halogeno group, a carboxy group, a nitro group, a cyano group, a methylenedioxy group, an acetoxy group, a methylthio group, an alkoxy group having 1 to 9 carbon atoms, an amino group optionally substituted with an alkyl group having 1 to 3 carbon atoms, a hydroxy group, or an alkyl group having 1 to 10 carbon atoms and being optionally substituted with a halogeno group; a represents an integer of 1 to 6; n11 represents an integer of 1 or 2; r5 represents an integer of 0 to 3; and * represents a bonding site between the compound of formula (5-1) and the compound of formula (5-1-a).

The description of the above terms is as given above.

A specific example of the compounds represented by formula (5-1) and formula (5-1-a) is shown below.

[Formula 20]
(2-2-t)
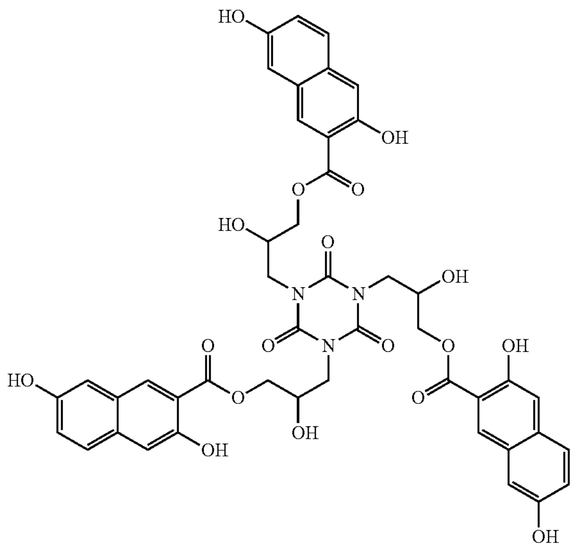
Compound (B) having a phenolic hydroxy group other than catechol may be a compound shown below.
[Formula 21]
(2-2-a)
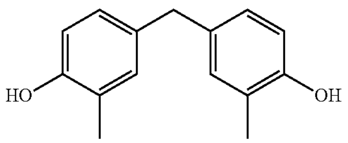
(2-2-b)
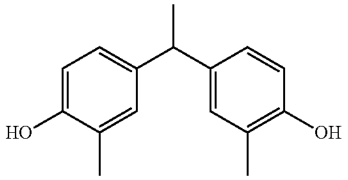
(2-2-d)
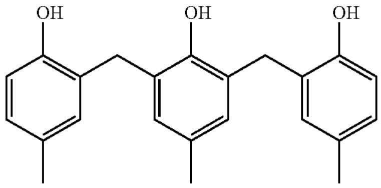
(2-2-e)
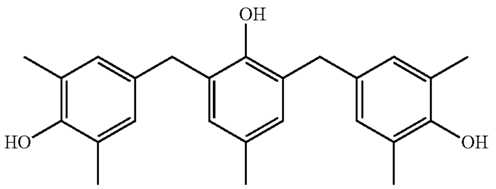
-continued
(2-2-f)
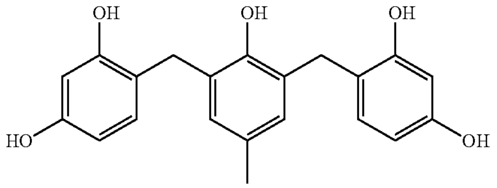
(2-2-i)
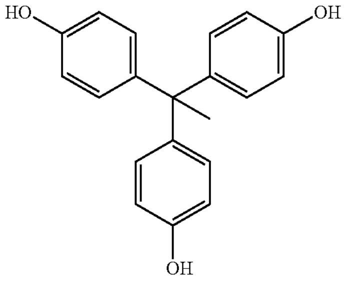
(2-2-c)
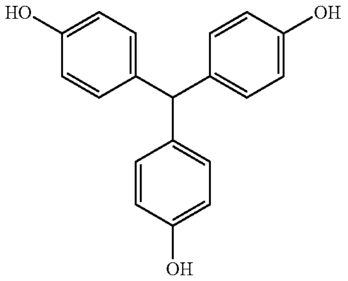
(2-2-j)
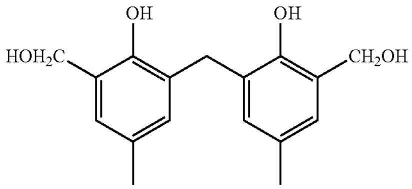
(2-2-k)
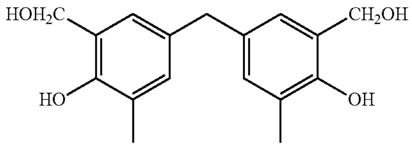
(2-2-l)
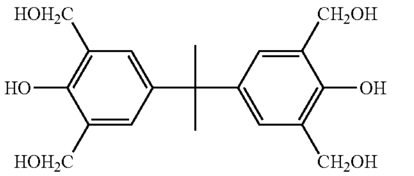
(2-2-m)
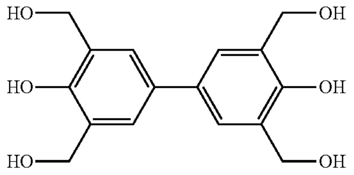
(2-2-n)
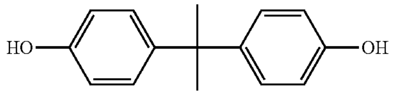

-continued (2-2-o)

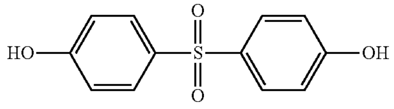

[Formula 22]

(2-2-p)

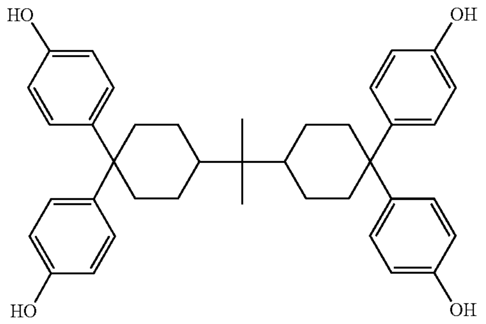

(2-2-q)

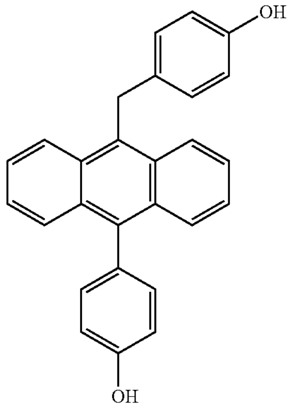

[3] Polymer Having a Phenolic Hydroxy Group Other than Catechol

With respect to compound or polymer (B) having a phenolic hydroxy group other than catechol, there is no particular limitation as long as the compound or polymer can be polymer (B) having a phenolic hydroxy group other than catechol and does not harm the advantageous effects of the present invention.

Polymer (B) preferably has at least three or more repeating unit structures.

With respect to the weight average molecular weight of polymer (B), there is no particular limitation, but, for example, the weight average molecular weight is within the range of 1,000 to 50,000.

Polymer (B) preferably has a unit structure represented by the following formula (3-1):

[Formula 23]

(Formula 3-1)

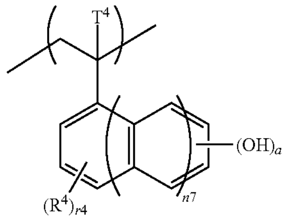

wherein $T^4$ represents a hydrogen atom in addition to the alkyl group having 1 to 10 carbon atoms and being optionally substituted with a halogeno group; $R^4$ represents a halogeno group, a carboxy group, a nitro group, a cyano group, a methylenedioxy group, an acetoxy group, a methylthio group, an alkoxy group having 1 to 9 carbon atoms, an amino group optionally substituted with an alkyl group having 1 to 3 carbon atoms, a hydroxy group, or an alkyl group having 1 to 10 carbon atoms and being optionally substituted with a halogeno group; r4 represents an integer of 0 to 3; n7 represents an integer of 0 to 2; and a represents an integer of 1 to 6.

The description of the halogeno group, alkyl group, and alkoxy group is as given above.

The polymer represented by formula (3-1) above may be a polymer having one type of the unit structure represented by formula (3-1), or may be a copolymer having two or more types of the unit structure.

Specific examples of polymer (B) represented by formula (3-1) above include the polymers having a unit structure shown below.

[Formula 24]

(3-1-a)

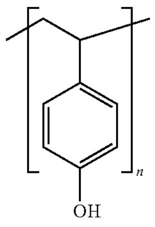

(3-1-b)

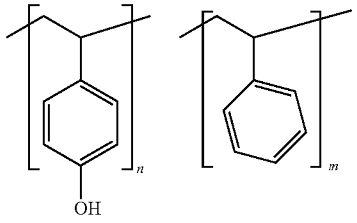

(3-1-c)

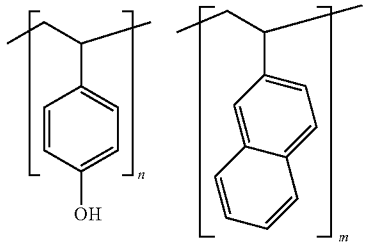

-continued
(3-1-d)
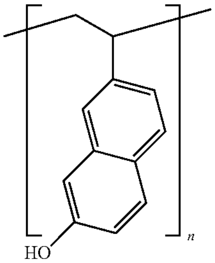
(3-1-e)
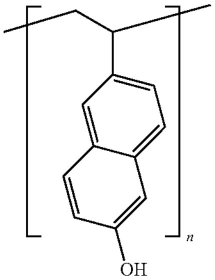
(3-1-f)
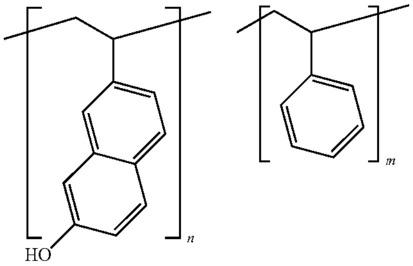
(3-1-g)
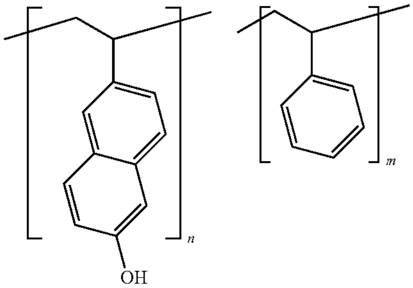
(3-1-h)
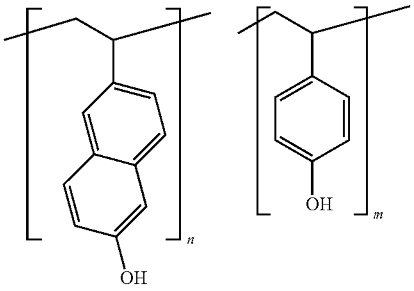
-continued
(3-1-i)
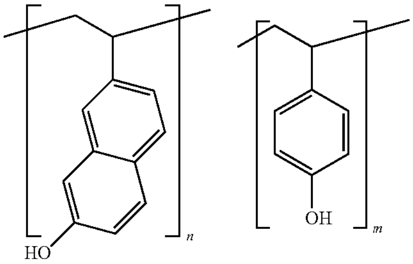
(3-1-j)
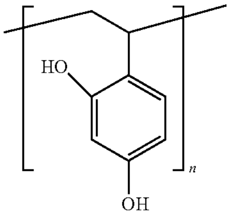
(3-1-k)
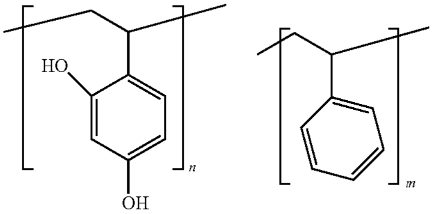
(3-1-l)
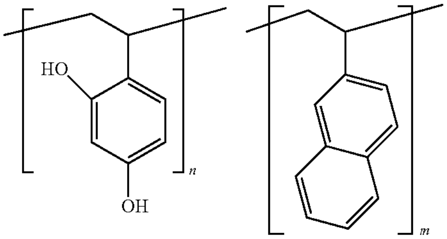
(3-1-m)
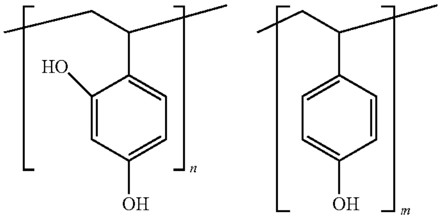
(3-1-n)
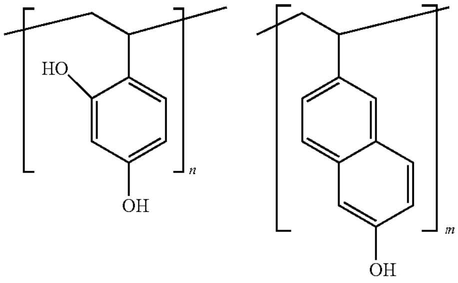

-continued (3-1-o)

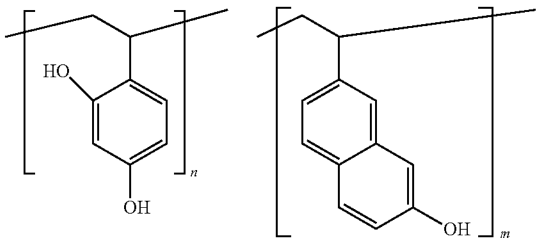

(In the above formulae, m and n shown on the right of the repeating units represent a molar ratio for copolymerization.)

<Thermal Acid Generator>

The composition for forming a protective film of the present invention may further contain a thermal acid generator.

Examples of thermal acid generators include pyridinium p-toluenesulfonate, pyridinium trifluoromethanesulfonate, pyridinium p-phenolsulfonate, K-PURE [registered trademark] CXC-1612, K-PURE CXC-1614, K-PURE TAG-2172, K-PURE TAG-2179, K-PURE TAG-2678, K-PURE TAG2689 (each of which is manufactured by King Industries, Inc.), and SI-45, SI-60, SI-80, SI-100, SI-110, SI-150 (each of which is manufactured by Sanshin Chemical Industry Co., Ltd.).

These thermal acid generators may be used each alone or in combination of two or more thereof.

When the composition for forming a protective film of the present invention contains a thermal acid generator, the amount of the thermal acid generator contained is within the range of 0.0001 to 20% by mass, preferably 0.01 to 15% by mass, further preferably 0.1 to 10% by mass, based on the total mass of the solids in the composition for forming a protective film.

<Solvent>

The composition for forming a protective film of the present invention may be prepared by dissolving the above-mentioned components in a solvent, preferably an organic solvent, and is used in a uniform solution state.

With respect to the organic solvent for the composition for forming a protective film of the present invention, there is no particular limitation as long as it is an organic solvent which can dissolve therein the above-mentioned compound and the below-mentioned solid components including an acid catalyst, and any of such solvents may be used. Particularly, the composition for forming a protective film of the present invention is used in a uniform solution state, and therefore, taking the application properties of the composition into consideration, it is recommended that an organic solvent generally used in a lithography process should be used.

Examples of the organic solvents include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monoethyl ether, propylene glycol monomethyl ether acetate, propylene glycol propyl ether acetate, toluene, xylene, methyl ethyl ketone, methyl isobutyl ketone, cyclopentanone, cyclohexanone, cycloheptanone, 4-methyl-2-pentanol, methyl 2-hydroxyisobutyrate, ethyl 2-hydroxyisobutyrate, ethyl ethoxyacetate, 2-hydroxyethyl acetate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, 2-heptanone, methoxycyclopentane, anisole, γ-butyrolactone, N-methylpyrrolidone, N,N-dimethylformamide, and N,N-dimethylacetamide. These solvents may be used each alone or in combination of two or more thereof.

Of these solvents, for example, propylene glycol monomethyl ether, propylene glycol monomethyl ether acetate, ethyl lactate, butyl lactate, and cyclohexanone are preferred. Especially preferred are propylene glycol monomethyl ether and propylene glycol monomethyl ether acetate.

The composition for forming a protective film of the present invention generally has a solid content of 0.1 to 70% by mass, preferably 0.1 to 60% by mass. The solid content indicates a content proportion of all of the components left behind after removing the solvent from the composition for forming a protective film. Preferably, the proportion of the polymer represented by formula (1-1) above in the solids is within the range of 1 to 100% by mass, 1 to 99.9% by mass, 50 to 99.9% by mass, 50 to 95% by mass, and 50 to 90% by mass with increasing preference.

<Resist Underlayer Film-Forming Composition>

The resist underlayer film-forming composition of the present invention comprises:

(A) a polymer having a unit structure represented by the following formula (1-1):

[Formula 25]

Formula (1-1)

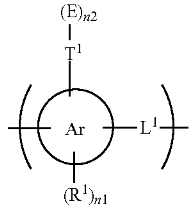

wherein Ar represents a benzene ring, a naphthalene ring, or an anthracene ring; $R^1$ represents a hydroxy group, a mercapto group optionally protected by a methyl group, an amino group optionally protected by a methyl group, a halogeno group, or an alkyl group having 1 to 10 carbon atoms and being optionally substituted with or interrupted by a heteroatom and optionally substituted with a hydroxy group; n1 represents an integer of 0 to 3; $L^1$ represents a single bond or an alkylene group having 1 to 10 carbon atoms; E represents an epoxy group; when n2 is 1, $T^1$ represents a single bond or an alkylene group having 1 to 10 carbon atoms and being optionally interrupted by an ether linkage, ester linkage, or amide linkage; and, when n2 is 2, $T^1$ represents a nitrogen atom or an amide linkage;

(B) a compound or polymer having a phenolic hydroxy group other than catechol;

(C) a thermal acid generator; and (D) a solvent.

The description of the terms for the resist underlayer film-forming composition of the present invention is the same as the description above in connection with the composition for forming a protective film.

<Protective Film, Resist Underlayer Film, Method for Producing a Substrate Having a Resist Pattern, and Method for Producing a Semiconductor Device>

Hereinbelow, a method for producing a substrate having a resist pattern and a method for producing a semiconductor device, each using the composition for forming a protective film (resist underlayer film-forming composition) of the present invention, will be described.

The substrate having a resist pattern in the present invention may be produced by applying the composition for forming a protective film (resist underlayer film-forming composition) described above onto a semiconductor substrate and baking the applied composition.

Examples of semiconductor substrates to which the composition for forming a protective film (resist underlayer film-forming composition) of the present invention is applied include a silicon wafer, a germanium wafer, and compound semiconductor wafers, such as gallium arsenide, indium phosphide, gallium nitride, indium nitride, and aluminum nitride.

When a semiconductor substrate having an inorganic film formed on a surface thereof is used, the inorganic film is formed by, for example, an ALD (atomic layer deposition) method, a CVD (chemical vapor deposition) method, a reactive sputtering method, an ion plating method, a vacuum deposition method, or a spin coating method (spin on glass: SOG). Examples of the inorganic films include a polysilicon film, a silicon oxide film, a silicon nitride film, a silicon nitride oxide film, a BPSG (Boro-Phospho Silicate Glass) film, a titanium nitride film, a titanium nitride oxide film, a tungsten nitride film, a gallium nitride film, and a gallium arsenide film. The semiconductor substrate may be a stepped substrate having formed therein the so-called via (hole) and trench, for example. For example, the via has a substantially circular form, as viewed from the top surface, and the substantially circular form has a diameter of, for example, 2 to 20 nm and a depth of 50 to 500 nm, and the trench has, for example, a trench (depressed portion of the substrate) width of 2 to 20 nm and a trench depth of 50 to 500 nm. With respect to the composition for forming a protective film (resist underlayer film-forming composition) of the present invention, the compound contained in the composition has a small weight average molecular weight and a small average particle diameter, and therefore embedding for the above-mentioned stepped substrate with the composition can be achieved without causing defects, such as voids. In view of the subsequent steps in the production of a semiconductor (wet etching/dry etching for the semiconductor substrate, and resist pattern formation), that the substrate has no defects, such as voids, is an important property.

The composition for forming a protective film (resist underlayer film-forming composition) of the present invention is applied onto the above-mentioned semiconductor substrate by an appropriate application method, such as a spinner or a coater. Then, the applied composition is baked using a heating means, such as a hotplate, to form a protective film (resist underlayer film). Conditions for baking are appropriately selected from those at a baking temperature of 100 to 400° C. for a baking time of 0.3 to 60 minutes. Preferred conditions for baking are those at a baking temperature of 120 to 350° C. for a baking time of 0.5 to 30 minutes, and more preferred conditions are those at a baking temperature of 150 to 300° C. for a baking time of 0.8 to 10 minutes. The thickness of the formed protective film is, for example, within the range of 0.001 to 10 m, preferably 0.002 to 1 m, more preferably 0.005 to 0.5 m. When the temperature during the baking is lower than the above range, it is likely that crosslinking unsatisfactorily proceeds, making it difficult to obtain a resistance of the formed protective film (resist underlayer film-forming composition) to a resist solvent or a basic aqueous hydrogen peroxide solution. On the other hand, when the temperature during the baking is higher than the above range, the resultant protective film (resist underlayer film) is likely to suffer decomposition due to heat.

Exposure is conducted through a mask (reticle) for forming a predetermined pattern; and, for example, an i-line, a KrF excimer laser, an ArF excimer laser, an EUV (extreme ultraviolet light), or an EB (electron beam) is used. In development, an alkaline developer is used, and conditions are appropriately selected from those at a development temperature of 5 to 50° C. for a development time of 10 to 300 seconds. As an alkaline developer, there may be used, for example, an aqueous solution of an alkali, e.g., an inorganic alkali, such as sodium hydroxide, potassium hydroxide, sodium carbonate, sodium silicate, sodium metasilicate, or aqueous ammonia; a primary amine, such as ethylamine or n-propylamine; a secondary amine, such as diethylamine or di-n-butylamine; a tertiary amine, such as triethylamine or methyldiethylamine; an alcohol amine, such as dimethylethanolamine or triethanolamine; a quaternary ammonium salt, such as tetramethylammonium hydroxide, tetraethylammonium hydroxide, or choline; or a cyclic amine, such as pyrrole or piperidine. Moreover, the above-mentioned aqueous alkali solution may also be used while adding thereto an alcohol, such as isopropyl alcohol, or a surfactant, such as a nonionic surfactant, in an appropriate amount. Of these, a preferred developer is a quaternary ammonium salt; and further preferred are tetramethylammonium hydroxide and choline. Further, for example, a surfactant may be added to the above developer. Instead of the method using an alkaline developer, a method, in which development is conducted using an organic solvent, such as butyl acetate, to develop a portion of the photoresist, in which the alkali dissolution rate is not improved, may be used.

Then, using the formed resist pattern as a mask, the protective film (resist underlayer film-forming composition) is subjected to dry etching. In this instance, when the above-mentioned inorganic film is formed on a surface of the semiconductor substrate used, the surface of the inorganic film is exposed; and, when no inorganic film is formed on a surface of the semiconductor substrate used, the surface of the semiconductor substrate is exposed.

Moreover, using the protective film (resist underlayer film-forming composition) obtained after dry etching (including the resist pattern in the case where the resist pattern remains on the protective film/resist underlayer film) as a mask, the resultant substrate is subjected to wet etching using a wet etching liquid for semiconductor, forming a desired pattern.

With respect to the wet etching liquid for semiconductor, a general chemical liquid for etching a wafer for semiconductor may be used; and, for example, any of a substance exhibiting acidic properties and a substance exhibiting basic properties may be used.

Examples of substances exhibiting acidic properties include hydrogen peroxide, hydrofluoric acid, ammonium fluoride, acidic ammonium fluoride, ammonium hydrogenfluoride, buffered hydrofluoric acid, hydrochloric acid, nitric acid, sulfuric acid, phosphoric acid, and a mixture thereof.

Examples of substances exhibiting basic properties include a basic aqueous hydrogen peroxide solution obtained by mixing an aqueous hydrogen peroxide solution with ammonia, sodium hydroxide, potassium hydroxide, sodium cyanide, potassium cyanide, or an organic amine, such as triethanolamine, so that the pH of the resultant solution becomes on the basic side. Specific example includes SC-1 (ammonia-hydrogen peroxide solution). In addition, as a chemical liquid for wet etching, there may be used a mixture of an aqueous hydrogen peroxide solution and a substance capable of making the pH be on the basic side, for example, urea in such a way that the mixture is heated to allow urea to undergo thermal decomposition, to generate ammonia, which makes the pH of the resultant solution eventually on the basic side.

Of these, preferred is an acidic aqueous hydrogen peroxide solution or a basic aqueous hydrogen peroxide solution.

These chemical liquids may contain an additive, such as a surfactant.

The temperature at which the wet etching liquid for semiconductor is used is desirably within the range of 25 to 90° C., further desirably 40 to 80° C. The wet etching time is desirably within the range of 0.5 to 30 minutes, further desirably 1 to 20 minutes.

EXAMPLES

Hereinbelow, the contents of the present invention will be described in more detail with reference to the following Examples, which should not be construed as limiting the scope of the present invention.

The weight average molecular weight of the compounds shown in Synthesis Examples 1 to 8 below of the present description is the result of the measurement made by gel permeation chromatography (hereinafter, referred to simply as "GPC"). In the measurement, a GPC apparatus, manufactured by Tosoh Corp., was used and conditions for the measurement and others are shown below.

GPC Column: Shodex KF803L, Shodex KF802, Shodex KF801 [registered trademark](Showa Denko K.K.)

Column temperature: 40° C.

Solvent: Tetrahydrofuran (THF)

Flow rate: 1.0 ml/minute

Standard sample: Polystyrene (manufactured by Tosoh Corp.)

Description of Terms

PGME: Propylene glycol monomethyl ether

PGMEA: Propylene glycol monomethyl ether acetate

Example 1

With 5.92 g of an epoxy novolak resin EOCN-104S (product from Nippon Kayaku Co., Ltd., and corresponds to formula (a-1)) (30% by mass PGMEA solution; weight average molecular weight: 3,100) were mixed 5.91 g of TrisP-HAP (product from Honshu Chemical Industry Co., Ltd., and corresponds to formula (a-2)) (6% by mass PGME solution), 3.55 g of K-PURE [registered trademark] TAG-2689 (product from King Industries, Inc.) (0.5% by mass PGME solution) as a thermal acid generator, 0.18 g of R-40-LM (DIC Corporation) (1% by mass PGMEA solution), 29.18 g of PGMEA, and 5.26 g of PGME, obtaining a solution having a solid content of 4.3% by mass. The obtained solution was filtered with a polytetrafluoroethylene microfilter having a pore diameter of 0.2 μm to prepare a composition for forming a protective film.

[Formula 26]

(a-1)

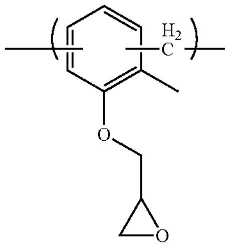

[Formula 27]

(a-2)

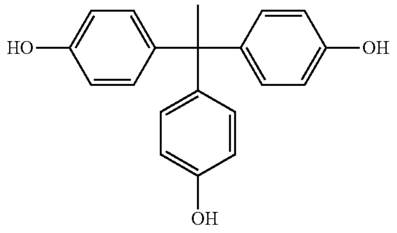

Example 2

With 5.32 g of an epoxy novolak resin EOCN-104S (product from Nippon Kayaku Co., Ltd., and corresponds to formula (a-1)) (30% by mass PGMEA solution; weight average molecular weight: 3,100) were mixed 10.63 g of TrisP-HAP (product from Honshu Chemical Industry Co., Ltd., and corresponds to formula (a-2)) (6% by mass PGME solution), 3.19 g of K-PURE [registered trademark] TAG-2689 (product from King Industries, Inc.) (0.5% by mass PGME solution) as a thermal acid generator, 0.18 g of R-40-LM (DIC Corporation) (1% by mass PGMEA solution), 29.55 g of PGMEA, and 1.16 g of PGME, obtaining a solution having a solid content of 4.5% by mass. The obtained solution was filtered with a polytetrafluoroethylene microfilter having a pore diameter of 0.2 μm to prepare a composition for forming a protective film.

[Formula 28]

(a-1)

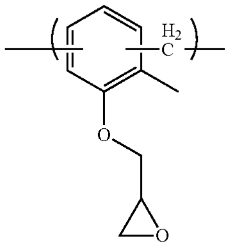

[Formula 29]

(a-2)

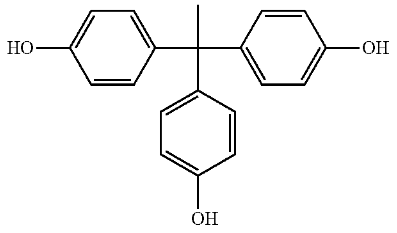

Example 3

With 2.40 g of an epoxy novolak resin EOCN-104S (product from Nippon Kayaku Co., Ltd., and corresponds to formula (a-1)) (30% by mass PGMEA solution; weight average molecular weight: 3,100) were mixed 0.24 g of VP-8000 (product from Nippon Soda Co., Ltd., and corresponds to formula (a-3); weight average molecular weight: 10,257) (30% by mass PGMEA solution), 0.72 g of K-PURE [registered trademark] TAG-2689 (product from King Industries, Inc.) (1% by mass PGME solution) as a thermal acid generator, 0.072 g of R-40-LM (DIC Corporation) (1% by mass PGMEA solution), 11.52 g of PGMEA, and 5.05 g of PGME, obtaining a solution having a solid content of 4.0% by mass. The obtained solution was filtered with a polytetrafluoroethylene microfilter having a pore diameter of 0.2 μm to prepare a composition for forming a protective film.

[Formula 30]

(a-5)

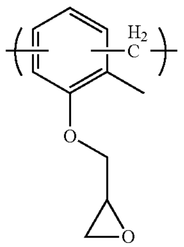

[Formula 31]

(a-3)

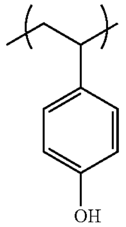

Example 4

With 2.03 g of an epoxy novolak resin EOCN-104S (product from Nippon Kayaku Co., Ltd., and corresponds to formula (a-1)) (30% by mass PGMEA solution; weight average molecular weight: 3,100) were mixed 0.61 g of VP-8000 (product from Nippon Soda Co., Ltd., and corresponds to formula (a-3); weight average molecular weight: 10,257) (30% by mass PGMEA solution), 0.61 g of K-PURE [registered trademark] TAG-2689 (product from King Industries, Inc.) (1% by mass PGME solution) as a thermal acid generator, 0.061 g of R-40-LM (DIC Corporation) (1% by mass PGMEA solution), 11.53 g of PGMEA, and 5.16 g of PGME, obtaining a solution having a solid content of 4.0% by mass. The obtained solution was filtered with a polytetrafluoroethylene microfilter having a pore diameter of 0.2 μm to prepare a composition for forming a protective film.

[Formula 32]

(a-1)

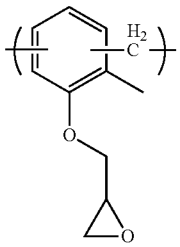

[Formula 33]

(a-3)

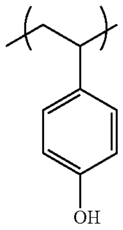

Example 5

With 3.60 g of an epoxy novolak resin EOCN-104S (product from Nippon Kayaku Co., Ltd., and corresponds to formula (a-1)) (30% by mass PGMEA solution; weight average molecular weight: 3,100) were mixed 2.70 g of TEP-DF (product from Asahi Yukizai Corporation, and corresponds to formula (a-4)) (4% by mass PGME solution), 1.08 g of K-PURE [registered trademark] TAG-2689 (product from King Industries, Inc.) (1% by mass PGME solution) as a thermal acid generator, 0.11 g of R-40-LM (DIC Corporation) (1% by mass PGMEA solution), 17.53 g of PGMEA, and 4.98 g of PGME, obtaining a solution having a solid content of 4.0% by mass. The obtained solution was filtered with a polytetrafluoroethylene microfilter having a pore diameter of 0.2 μm to prepare a composition for forming a protective film.

[Formula 34]

(a-1)

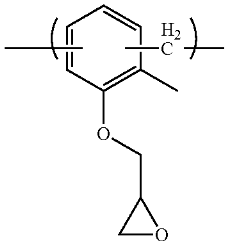

-continued

[Formula 35]

(a-4)

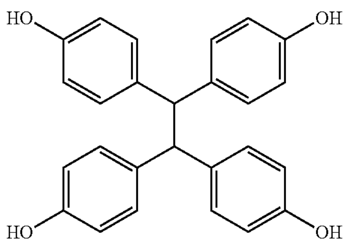

TEP-DF

Example 6

With 3.05 g of an epoxy novolak resin EOCN-104S (product from Nippon Kayaku Co., Ltd., and corresponds to formula (a-1)) (30% by mass PGMEA solution; weight average molecular weight: 3,100) were mixed 6.87 g of TEP-DF (product from Asahi Yukizai Corporation, and corresponds to formula (a-4)) (4% by mass PGME solution), 0.92 g of K-PURE [registered trademark] TAG-2689 (product from King Industries, Inc.) (1% by mass PGME solution) as a thermal acid generator, 0.092 g of R-40-LM (DIC Corporation) (1% by mass PGMEA solution), 17.93 g of PGMEA, and 1.14 g of PGME, obtaining a solution having a solid content of 4.0% by mass. The obtained solution was filtered with a polytetrafluoroethylene microfilter having a pore diameter of 0.2 μm to prepare a composition for forming a protective film.

[Formula 36]

(a-1)

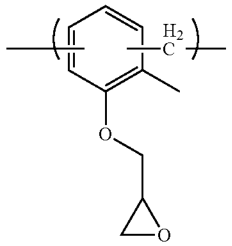

[Formula 37]

(a-4)

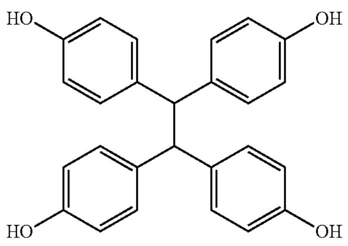

TEP-DF

Example 7

With 3.60 g of an epoxy novolak resin EOCN-104S (product from Nippon Kayaku Co., Ltd., and corresponds to formula (a-1)) (30% by mass PGMEA solution; weight average molecular weight: 3,100) were mixed 2.70 g of TEP-TPA (product from Asahi Yukizai Corporation, and corresponds to formula (a-5)) (4% by mass PGME solution), 1.08 g of K-PURE [registered trademark] TAG-2689 (product from King Industries, Inc.) (1% by mass PGME solution) as a thermal acid generator, 0.108 g of R-40-LM (DIC Corporation) (1% by mass PGMEA solution), 17.53 g of PGMEA, and 4.98 g of PGME, obtaining a solution having a solid content of 4.0% by mass. The obtained solution was filtered with a polytetrafluoroethylene microfilter having a pore diameter of 0.2 μm to prepare a composition for forming a protective film.

[Formula 38]

(a-1)

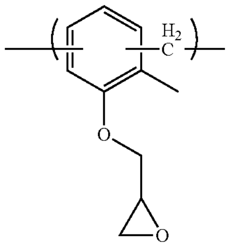

[Formula 39]

(a-5)

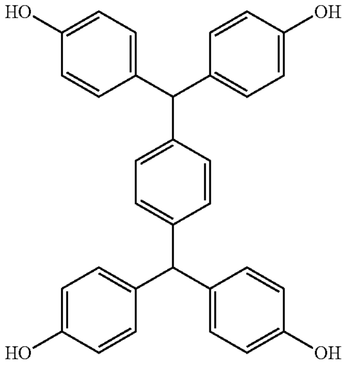

TEP-TPA

Example 8

With 3.05 g of an epoxy novolak resin EOCN-104S (product from Nippon Kayaku Co., Ltd., and corresponds to formula (a-1)) (30% by mass PGMEA solution; weight average molecular weight: 3,100) were mixed 6.87 g of TEP-TPA (product from Asahi Yukizai Corporation, and corresponds to formula (a-5)) (4% by mass PGME solution), 0.92 g of K-PURE [registered trademark] TAG-2689 (product from King Industries, Inc.) (1% by mass PGME solution) as a thermal acid generator, 0.092 g of R-40-LM (DIC Corporation) (1% by mass PGMEA solution), 17.93 g of PGMEA, and 1.14 g of PGME, obtaining a solution having a solid content of 4.0% by mass. The obtained solution was filtered with a polytetrafluoroethylene microfilter having a pore diameter of 0.2 μm to prepare a composition for forming a protective film.

[Formula 40]

(a-1)

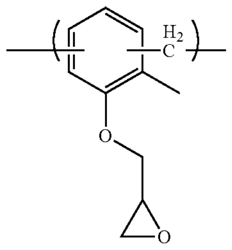

[Formula 41]

(a-5)

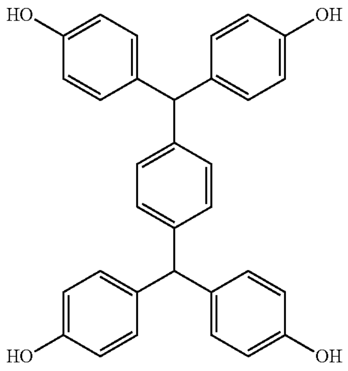

TEP-TPA

Example 9

With 2.40 g of an epoxy novolak resin EOCN-104S (product from Nippon Kayaku Co., Ltd., and corresponds to formula (a-1)) (30% by mass PGMEA solution; weight average molecular weight: 3,100) were mixed 0.24 g of NM8280G (product from Asahi Yukizai Corporation, and corresponds to formula (a-6); weight average molecular weight: 6,819) (30% by mass PGMEA solution), 0.72 g of K-PURE [registered trademark] TAG-2689 (product from King Industries, Inc.) (1% by mass PGME solution) as a thermal acid generator, 0.072 g of R-40-LM (DIC Corporation) (1% by mass PGMEA solution), 11.52 g of PGMEA, and 5.05 g of PGME, obtaining a solution having a solid content of 4.0% by mass. The obtained solution was filtered with a polytetrafluoroethylene microfilter having a pore diameter of 0.2 μm to prepare a composition for forming a protective film.

[Formula 42]

(a-1)

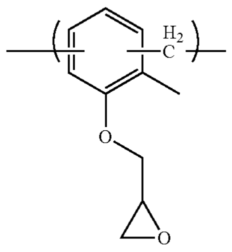

-continued

[Formula 43]

(a-6)

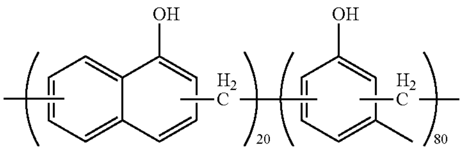

Example 10

With 2.03 g of an epoxy novolak resin EOCN-104S (product from Nippon Kayaku Co., Ltd., and corresponds to formula (a-1)) (30% by mass PGMEA solution; weight average molecular weight: 3,100) were mixed 0.60 g of NM8280G (product from Asahi Yukizai Corporation, and corresponds to formula (a-6); weight average molecular weight: 6,819) (30% by mass PGMEA solution), 0.61 g of K-PURE [registered trademark] TAG-2689 (product from King Industries, Inc.) (1% by mass PGME solution) as a thermal acid generator, 0.061 g of R-40-LM (DIC Corporation) (1% by mass PGMEA solution), 11.53 g of PGMEA, and 5.76 g of PGME, obtaining a solution having a solid content of 4.0% by mass. The obtained solution was filtered with a polytetrafluoroethylene microfilter having a pore diameter of 0.2 μm to prepare a composition for forming a protective film.

[Formula 44]

(a-1)

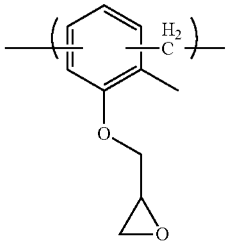

[Formula 45]

(a-6)

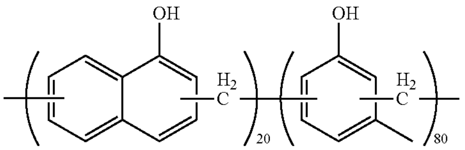

Comparative Example 1

With 7.46 g of an epoxy novolak resin EOCN-104S (product from Nippon Kayaku Co., Ltd., and corresponds to formula (a-1)) (30% by mass PGMEA solution; weight average molecular weight: 3,100) were mixed 2.68 g of K-PURE [registered trademark] TAG-2689 (product from King Industries, Inc.) (0.5% by mass PGME solution) as a thermal acid generator, 28.21 g of PGMEA, and 11.65 g of PGME, obtaining a solution having a solid content of 4.5% by mass. The obtained solution was filtered with a polytetrafluoroethylene microfilter having a pore diameter of 0.2 m to prepare a composition for forming a protective film.

[Formula 46]

(a-1)

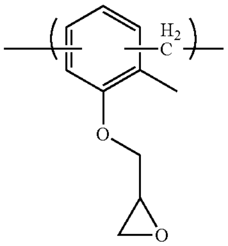

(Formation of a Film)

Each of the compositions for forming a protective film prepared in Examples 1 to 10 and the composition for forming a film prepared in Comparative Example 1 was applied by spin coating onto a silicon substrate having a titanium nitride film formed on the surface thereof, and baked at 250° C. for 60 seconds to form a film having a thickness of 100 nm.

(Test for Resistance to a Basic Aqueous Hydrogen Peroxide Solution)

The films formed using each of the compositions for forming a protective film prepared in Examples 1 to 10 and the composition for forming a protective film prepared in Comparative Example 1 on the silicon substrate having a titanium nitride film formed on the surface thereof were immersed in a basic aqueous hydrogen peroxide solution having the composition shown in Table 1 below at the temperature shown in Table 1, washed with water and dried, and then the state of the films was visually observed. The results are shown in Table 2 below. The figures shown in Table 2 indicate a ratio of the time at which peeling was observed to that in the Comparative Example as a reference.

TABLE 1

Table 1

| 28 mass % Aqueous ammonia | 33 mass % Aqueous hydrogen peroxide solution | Ultrapure water | Temperature |
|---|---|---|---|
| 40 ml | 40 ml | 80 ml | 50° C. |

TABLE 2

| Example 1 | Example 2 | Example 3 | Example 4 | Example 5 | Example 6 | Example 7 | Example 8 | Example 9 | Example 10 | Comparative Example 1 |
|---|---|---|---|---|---|---|---|---|---|---|
| 1.2 | 1.3 | 1.5 | 1.2 | 1.1 | 1.1 | 1.1 | 1.1 | 1.1 | 1.1 | 1.0 |

From the results shown in Table 2 above, it has been found that the films formed using the compositions for forming a protective film prepared in Examples 1 to 10 have an improved resistance to a basic aqueous hydrogen peroxide solution, as compared to the film formed in Comparative Example 1.

(Test for Optical Parameter)

Each of the compositions for forming a protective film prepared in Examples 1 to 10 and Comparative Example 1 described in the present description was applied onto a silicon wafer using a spinner. The applied composition was baked on a hotplate at 250° C. for one minute to form a resist underlayer film (thickness: 50 nm). With respect to each of the formed resist underlayer films, an n value (refractive index) and a k value (attenuation coefficient or absorption coefficient) at a wavelength of 193 nm and at a wavelength of 248 nm were determined using a spectroscopic ellipsometer (VUV-VASE VU-302, J. A. Woollam Co., Inc.). The results are shown in Table 3.

TABLE 3

Table 3

| | n/k @193 nm | n/k @248 nm |
|---|---|---|
| Example 1 | 1.45/0.58 | 1.87/0.07 |
| Example 2 | 1.44/0.61 | 1.87/0.08 |
| Example 3 | 1.46/0.59 | 1.85/0.06 |
| Example 4 | 1.49/0.65 | 1.85/0.07 |
| Example 5 | 1.45/0.56 | 1.86/0.07 |
| Example 6 | 1.45/0.59 | 1.86/0.08 |
| Example 7 | 1.45/0.59 | 1.88/0.05 |
| Example 8 | 1.45/0.65 | 1.90/0.07 |
| Example 9 | 1.44/0.58 | 1.90/0.05 |
| Example 10 | 1.42/0.59 | 1.90/0.08 |
| Comparative Example 1 | 1.45/0.56 | 1.88/0.03 |

INDUSTRIAL APPLICABILITY

The composition for forming a protective film of the present invention provides a protective film which has excellent resistance to a wet etching liquid used for processing of a substrate and has a low dry etching rate, reducing a damage to the protective film during processing of the substrate. The resist underlayer film-forming composition of the present invention has excellent resistance to a wet etching liquid used for processing of a substrate and has a low dry etching rate, and further has excellent resistance to a wet etching liquid used for processing of a substrate.

The invention claimed is:

1. A composition for forming a protective film against a wet etching liquid for semiconductor or a resist underlayer film-forming composition, the composition comprising:

(A) a polymer having a unit structure represented by the following formula (1-1):

Formula (1-1)

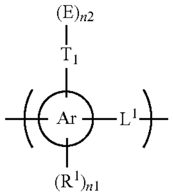

wherein Ar represents a benzene ring, a naphthalene ring, or an anthracene ring; $R^1$ represents a hydroxy group, a mercapto group optionally protected by a methyl group, an amino group optionally protected by a methyl group, a halogeno group, or an alkyl group having 1 to 10 carbon atoms and being optionally substituted with or interrupted by a heteroatom and optionally substituted with a hydroxy group; n1 represents an integer of 0 to 3; $L^1$ represents a single bond or an alkylene group having 1 to 10 carbon atoms; E represents an epoxy group; and, when n2 is 1, $T^1$ represents a single bond or an alkylene group having 1 to 10 carbon atoms and being optionally interrupted by an ether linkage, ester linkage, or amide linkage; and, when n2 is 2, $T^1$ represents a nitrogen atom or an amide linkage;

(B) a compound or polymer having a phenolic hydroxy group other than catechol, wherein the compound or polymer (B) is represented by the following formula (2-1):

(Formula 2-1)

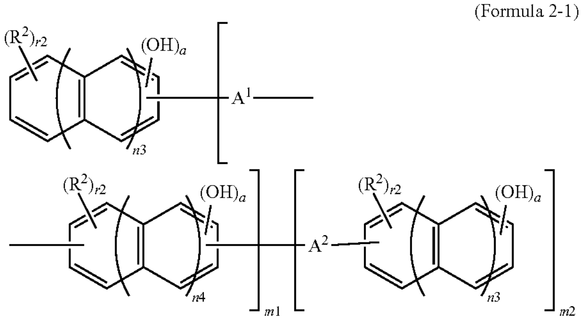

wherein each of $R^2$ and $T^2$ independently represents a halogeno group, a carboxy group, a nitro group, a cyano group, a methylenedioxy group, an acetoxy group, a methylthio group, an alkoxy group having 1 to 9 carbon atoms, an amino group optionally substituted with an alkyl group having 1 to 3 carbon atoms, a hydroxy group, or an alkyl group having 1 to 10 carbon atoms and being optionally substituted with a halogeno group; each of $A^1$ and $A^2$ independently is an alkylene group having 1 to 10 carbon atoms, a divalent organic group derived from a bicyclo-ring compound, a biphenylene group, a divalent organic group represented by $—CT^2T^3-$, or a combination thereof, wherein $T^3$ represents a hydrogen atom or a monovalent group represented by (formula 2-1-a):

(Formula 2-1-a)

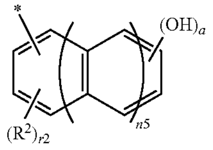

wherein, in (formula 2-1-a), * represents a bonding site to the carbon atom to which $T^3$ is bonded, and a represents an integer of 1 to 6;

each of n3 to n5 independently represents an integer of 0 to 2; r2 represents an integer of 0 to 3; and each of m1 and m2 independently represents a number of 0 to 10,000,000;

(C) a thermal acid generator; and (D) a solvent.

2. The composition f according to claim 1, wherein m1, n3 to n5, and r2 are 0; and m2 is 1.

3. A composition for forming a protective film against a wet etching liquid for semiconductor or a resist underlayer film-forming composition, the composition comprising:

(A) a polymer having a unit structure represented by the following formula (1-1):

Formula (1-1)

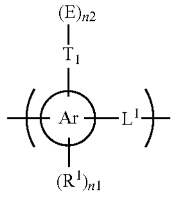

wherein Ar represents a benzene ring, a naphthalene ring, or an anthracene ring; $R^1$ represents a hydroxy group, a mercapto group optionally protected by a methyl group, an amino group optionally protected by a methyl group, a halogeno group, or an alkyl group having 1 to 10 carbon atoms and being optionally substituted with or interrupted by a heteroatom and optionally substituted with a hydroxy group; n1 represents an integer of 0 to 3; $L^1$ represents a single bond or an alkylene group having 1 to 10 carbon atoms; E represents an epoxy group; and, when n2 is 1, $T^1$ represents a single bond or an alkylene group having 1 to 10 carbon atoms and being optionally interrupted by an ether linkage, ester linkage, or amide linkage; and, when n2 is 2, $T^1$ represents a nitrogen atom or an amide linkage;

(B) a compound or polymer having a phenolic hydroxy group other than catechol, wherein the compound or polymer (B) is a compound represented by the following formula (2-2):

(Formula 2-2)

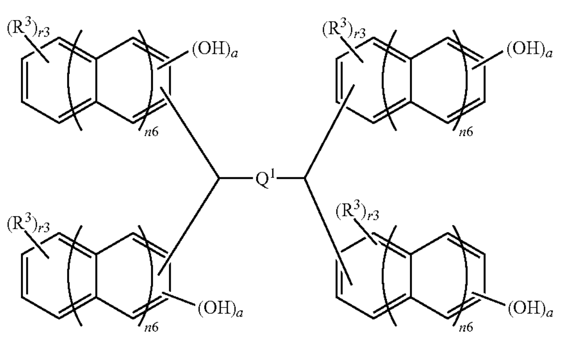

wherein $R^3$ represents a halogeno group, a carboxy group, a nitro group, a cyano group, a methylenedioxy group, an acetoxy group, a methylthio group, an alkoxy group having 1 to 9 carbon atoms, an amino group optionally substituted with an alkyl group having 1 to 3 carbon atoms, a hydroxy group, or an alkyl group having 1 to 10 carbon atoms and being optionally substituted with a halogeno group; $Q^1$ represents a single bond, an oxygen atom, a sulfur atom, a sulfonyl group, a carbonyl group, an imino group, an arylene group having 6 to 40 carbon atoms, or an alkylene group having 1 to 10 carbon atoms and being optionally substituted with a halogeno group; a represents an integer of 1 to 6; n6 represents an integer of 0 to 2; and r3 represents an integer of 0 to 3;

(C) a thermal acid generator; and (D) a solvent.

4. A composition for forming a protective film against a wet etching liquid for semiconductor or a resist underlayer film-forming composition, the composition comprising:

(A) a polymer having a unit structure represented by the following formula (1-1):

Formula (1-1)

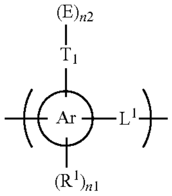

wherein Ar represents a benzene ring, a naphthalene ring, or an anthracene ring; $R^1$ represents a hydroxy group, a mercapto group optionally protected by a methyl group, an amino group optionally protected by a methyl group, a halogeno group, or an alkyl group having 1 to 10 carbon atoms and being optionally substituted with or interrupted by a heteroatom and optionally substituted with a hydroxy group; n1 represents an integer of 0 to 3; $L^1$ represents a single bond or an alkylene group having 1 to 10 carbon atoms; E represents an epoxy group; and, when n2 is 1, $T^1$ represents a single bond or an alkylene group having 1 to 10 carbon atoms and being optionally interrupted by an ether linkage, ester linkage, or amide linkage; and, when n2 is 2, $T^1$ represents a nitrogen atom or an amide linkage;

(B) a compound or polymer having a phenolic hydroxy group other than catechol, wherein the compound or polymer (B) is a polymer having a unit structure represented by the following formula (3-1):

(Formula 3-1)

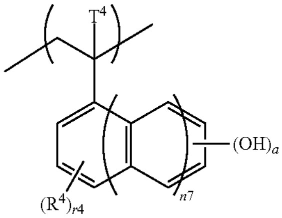

wherein $T^4$ represents a hydrogen atom in addition to the alkyl group having 1 to 10 carbon atoms and being optionally substituted with a halogeno group; $R^4$ represents a halogeno group, a carboxy group, a nitro group, a cyano group, a methylenedioxy group, an acetoxy group, a methylthio group, an alkoxy group having 1 to 9 carbon atoms, an amino group optionally substituted with an alkyl group having 1 to 3 carbon atoms, a hydroxy group, or an alkyl group having 1 to 10 carbon atoms and being optionally substituted with a halogeno group; r4 represents an integer of 0 to 3; n7 represents an integer of 0 to 2; and a represents an integer of 1 to 6;

(C) a thermal acid generator; and (D) a solvent.

5. A protective film against a wet etching liquid for semiconductor, which is a baked product of an applied film comprising the composition for forming a protective film according to claim 1.

6. A resist underlayer film, which is a baked product of an applied film comprising the resist underlayer film-forming composition according to claim 1.

7. A method for producing a substrate having a protective film, for use in the manufacture of a semiconductor, comprising the steps of:

applying the composition for forming a protective film according to claim 1 onto a stepped semiconductor substrate, and baking the applied composition to form a protective film.

8. A method for producing a substrate having a resist pattern, for use in the manufacture of a semiconductor, comprising the steps of:

applying the composition according to claim 1 onto a semiconductor substrate, and baking the applied composition to form a protective film as a resist underlayer film, and forming a resist film on the protective film and then subjecting the resist film to exposure and development to form a resist pattern.

9. A method for producing a semiconductor device, comprising the steps of:

forming a protective film on a semiconductor substrate optionally having an inorganic film formed on a surface thereof using the composition for forming a protective film according to claim 1, forming a resist pattern on the protective film, subjecting the protective film to dry etching using the formed resist pattern as a mask so as to expose a surface of the semiconductor substrate or inorganic film, and using the dry-etched protective film as a mask, subjecting the semiconductor substrate or inorganic film to wet etching using a wet etching liquid for semiconductor, and then to washing.

10. A method for producing a semiconductor device, comprising the steps of:

forming a resist underlayer film on a semiconductor substrate optionally having an inorganic film formed on a surface thereof using the resist underlayer film-forming composition according to claim 1, forming a resist pattern on the resist underlayer film, subjecting the resist underlayer film to dry etching using the formed resist pattern as a mask so as to expose a surface of the semiconductor substrate or inorganic film, and using the dry-etched resist underlayer film as a mask, subjecting the semiconductor substrate or inorganic film to etching.

11. A protective film against a wet etching liquid for semiconductor, which is a baked product of an applied film comprising the composition for forming a protective film according to claim 3.

12. A resist underlayer film, which is a baked product of an applied film comprising the resist underlayer film-forming composition according to claim 3.

13. A method for producing a substrate having a protective film, for use in the manufacture of a semiconductor, comprising the steps of:

applying the composition for forming a protective film according to claim 3 onto a stepped semiconductor substrate, and baking the applied composition to form a protective film.

14. A method for producing a substrate having a resist pattern, for use in the manufacture of a semiconductor, comprising the steps of:

applying the composition according to claim 3 onto a semiconductor substrate, and baking the applied composition to form a protective film as a resist underlayer film, and forming a resist film on the protective film and then subjecting the resist film to exposure and development to form a resist pattern.

15. A method for producing a semiconductor device, comprising the steps of:

forming a protective film on a semiconductor substrate optionally having an inorganic film formed on a surface thereof using the composition for forming a protective film according to claim 3, forming a resist pattern on the protective film, subjecting the protective film to dry etching using the formed resist pattern as a mask so as to expose a surface of the semiconductor substrate or inorganic film, and using the dry-etched protective film as a mask, subjecting the semiconductor substrate or inorganic film to wet etching using a wet etching liquid for semiconductor, and then to washing.

16. A method for producing a semiconductor device, comprising the steps of:

forming a resist underlayer film on a semiconductor substrate optionally having an inorganic film formed on a surface thereof using the resist underlayer film-forming composition according to claim 3, forming a resist pattern on the resist underlayer film, subjecting the resist underlayer film to dry etching using the formed resist pattern as a mask so as to expose a surface of the semiconductor substrate or inorganic film, and using the dry-etched resist underlayer film as a mask, subjecting the semiconductor substrate or inorganic film to etching.

17. A protective film against a wet etching liquid for semiconductor, which is a baked product of an applied film comprising the composition for forming a protective film according to claim 4.

18. A resist underlayer film, which is a baked product of an applied film comprising the resist underlayer film-forming composition according to claim 4.

19. A method for producing a substrate having a protective film, for use in the manufacture of a semiconductor, comprising the steps of:

applying the composition for forming a protective film according to claim 4 onto a stepped semiconductor substrate, and baking the applied composition to form a protective film.

20. A method for producing a substrate having a resist pattern, for use in the manufacture of a semiconductor, comprising the steps of:

applying the composition according to claim 4 onto a semiconductor substrate, and baking the applied composition to form a protective film as a resist underlayer film, and forming a resist film on the protective film and then subjecting the resist film to exposure and development to form a resist pattern.

21. A method for producing a semiconductor device, comprising the steps of:

forming a protective film on a semiconductor substrate optionally having an inorganic film formed on a surface thereof using the composition for forming a protective film according to claim 6, forming a resist pattern on the protective film, subjecting the protective film to dry etching using the formed resist pattern as a mask so as to expose a surface of the semiconductor substrate or inorganic film, and using the dry-etched protective film as a mask, subjecting the semiconductor substrate or inorganic film to wet etching using a wet etching liquid for semiconductor, and then to washing.

22. A method for producing a semiconductor device, comprising the steps of:

forming a resist underlayer film on a semiconductor substrate optionally having an inorganic film formed on a surface thereof using the resist underlayer film-forming composition according to claim 4, forming a resist pattern on the resist underlayer film, subjecting the resist underlayer film to dry etching using the formed resist pattern as a mask so as to expose a surface of the semiconductor substrate or inorganic film, and using the dry-etched resist underlayer film as a mask, subjecting the semiconductor substrate or inorganic film to etching.

* * * * *